United States Patent [19]

Dunand et al.

[11] 3,975,675
[45] Aug. 17, 1976

[54] IMPULSE RESPONSE MAGNETIC RESONANCE SPECTROMETER

[75] Inventors: Jean-Jacques Dunand; Jean Delayre, both of Courbevoie, France

[73] Assignee: Compagnie d'Applications Mecaniques a l'Electronique au Cinema et a l'Atomistique (C.A.M.E.C.A.), Paris, France

[22] Filed: Jan. 31, 1975

[21] Appl. No.: 546,082

[30] Foreign Application Priority Data
Feb. 5, 1974 France .................... 74.03781

[52] U.S. Cl. ........................ 324/.5 A; 324/.5 R
[51] Int. Cl.² ................................ G01R 33/08
[58] Field of Search ............... 324/.5 A, .5 AC, .5 R

[56] References Cited
UNITED STATES PATENTS

| | | | |
|---|---|---|---|
| 3,461,381 | 8/1969 | Nelson et al. | 324/.5 A |
| 3,566,256 | 2/1971 | LeRoy | 324/.5 A |
| 3,568,047 | 3/1971 | Look | 324/.5 A |
| 3,699,428 | 10/1972 | Leane | 324/.5 A |
| 3,714,550 | 1/1973 | Hyde | 324/.5 A |

Primary Examiner—R. V. Rolinec
Assistant Examiner—Michael J. Tokar
Attorney, Agent, or Firm—Cushman, Darby & Cushman

[57] ABSTRACT

The circuit for providing the high-frequency short signals which excite the specimen comprises a low-frequency oscillator linearly frequency-modulated during the course of time intervals of duration $T_o$ which are much shorter than their recurrence periodicity $T_r$; the output signal from the low frequency oscillator is frequency translated in a single side-band modulator supplied with a high-frequency wave by a high-frequency generator. An amplitude modulator makes it possible, in the course of the time intervals of duration $T_o$, to create gaps in the output signal from the single side band modulator or, instead, to increase the amplitude of said signal during part of the frequency sweep. It furthermore suppresses the signal outside said time intervals of duration $T_o$.

7 Claims, 11 Drawing Figures

IMPULSE RESPONSE MAGNETIC RESONANCE SPECTROMETER

The present invention relates to an improvement in magnetic resonance spectrometers for operating with impulse response.

Those skilled in the art will be aware that in magnetic resonance spectrometers, for example nuclear magnetic resonance spectrometers, the specimen is exposed on the one hand to a magnetic polarization field $H_o$ of constant polarity, and to a high-frequency electromagnetic field of amplitude $H_1$.

The magnetic resonance of a constituent (that is to say in the case of nuclear magnetic resonance, that of a nucleus) of the specimen having a gyro-magnetic factor of $\gamma$ occurs if the following relationship is satisfied $$\gamma H_o = w_o$$

where $w_o$ is the angular frequency of the electromagnetic field, if this field is a sinusoidal one, or of one of its spectral components if the contrary is the case.

The different constituents of the specimen can be detected successively by varying either $H_o$ or the angular frequency $w_o$ of a sinusoidal electromagnetic field. This kind of analysis will be referred to as sequential analysis.

However, it may be required to achieve a quicker result by utilising a constant field $H_o$ and a field $H_1$ having a very close spectrum and a sufficient amplitude throughout a range of frequencies $F_1$ to $F_2$. It is then possible to simultaneously excite resonance on the part of all the constituents which have gyro-magnetic factors within the interval from $2\pi F_1/H_o$ to $2\pi F_2/H_o$.

A known method of achieving this kind of electromagnetic excitation, consists in utilising pulse modulation for $H_1$.

To this end, the output signal from a sinusoidal high-frequency generator is pulse modulated and the high-frequency pulses, of recurrence frequency $F_r$, thus obtained are used to create the electromagnetic excitation field. The pulse modulation creates leteral spectrum lines centered on the frequency of the sinusoidal generator and separated by intervals whose width is equal to $F_r$.

Provided that the pulses are sufficiently short in relation to the relaxation times of the constituents of the specimen, the impulse response of the latter, generally obtained by means of a synchronous detector, will be a conventional impulse response in the sense which this term usually conveys in filter theory.

Consequently, the Fourier transform of this response will here have the same spectrum as that which is obtained by a conventional sequential analysis operation.

If, on the other hand, the recurrence periodicity $T_r$ of the excitation pulses is sufficiently long compared with the relaxation times of the specimen constituents, this impulse response, disregarding noise, will be repeated identically from one excitation pulse to the next.

Thus, in order to improve the signal-to-noise ratio, it is possible to compute the sum of the different impulse responses and calculate the Fourier transform of the sum response.

This Fourier transform, translated into an electrical signal can then be observed on an oscilloscope and/or recorded by a recorder.

The foregoing falls within the scope of the prior art.

The object of the present invention is a magnetic resonance spectrometer using impulse response obtained by means of excitations signals having an exceptionnally wide spectrum of relatively constant amplitude within a desired range of frequencies or within two or more desired ranges of frequencies, and which may be easily adapted for the obtainment of a resonance spectrum exhibiting selective characteristics.

In accordance with the invention, there is provided a magnetic resonance spectrometer for operating with impulse response, said spectrometer comprising: first means for the magnetic polarization of a specimen, second means for generating excitation signals having a period of recurrence $T_r$, and a duration $T_o$ shorter than $T_r$, said second means including a high-frequency oscillator, and a modulating circuit for both amplitude modulating and frequency modulating, with said period $T_r$, the output signal from said oscillator, so that each excitation signal be formed by at least one train of linearly frequency modulated oscillations; and detecting means for detecting the impulse response of said specimen to each of said excitation signals.

It should be pointed out that it is known to excite a specimen by means of a wave frequency modulated by a sequence of slope signals separated by time intervals shorter than their own duration. In this case, at the end of a number of modulation cycles, a stable state, disregarding noise, is established. This technique is radically different from the technique utilized in the spectrometer according to the invention, because it does not exploit the impulse response of the specimen. This is simply a rapid repetition of the sequential method of analysis, and does not yield the advantages, as far as the quality of the final resonance signal with is obtained is concerned, which are offered by producing impulse responses by the use of short, frequency modulated excitation signals.

The invention will be better understood and other of its features rendered apparent from a consideration of the ensuing description and the related drawings in which.

Figure 1:
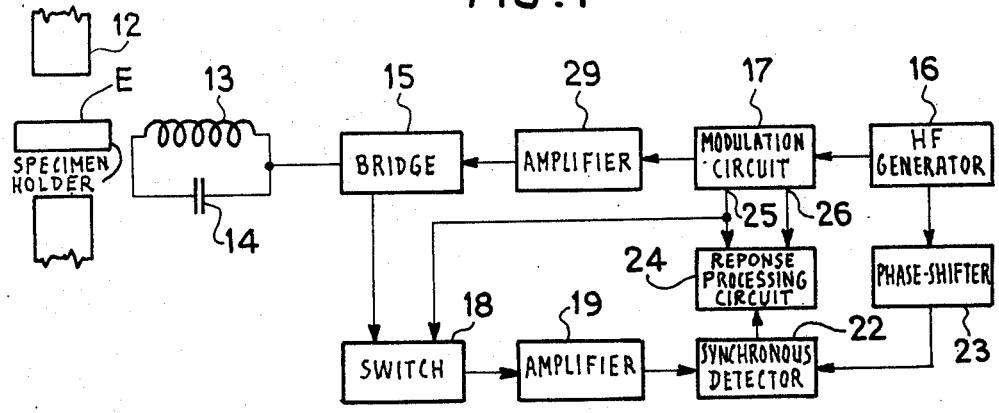
FIG. 1 is a schematic diagram of an embodiment of a nuclear magnetic resonance spectrometer in accordance with the invention.
Figure 4:
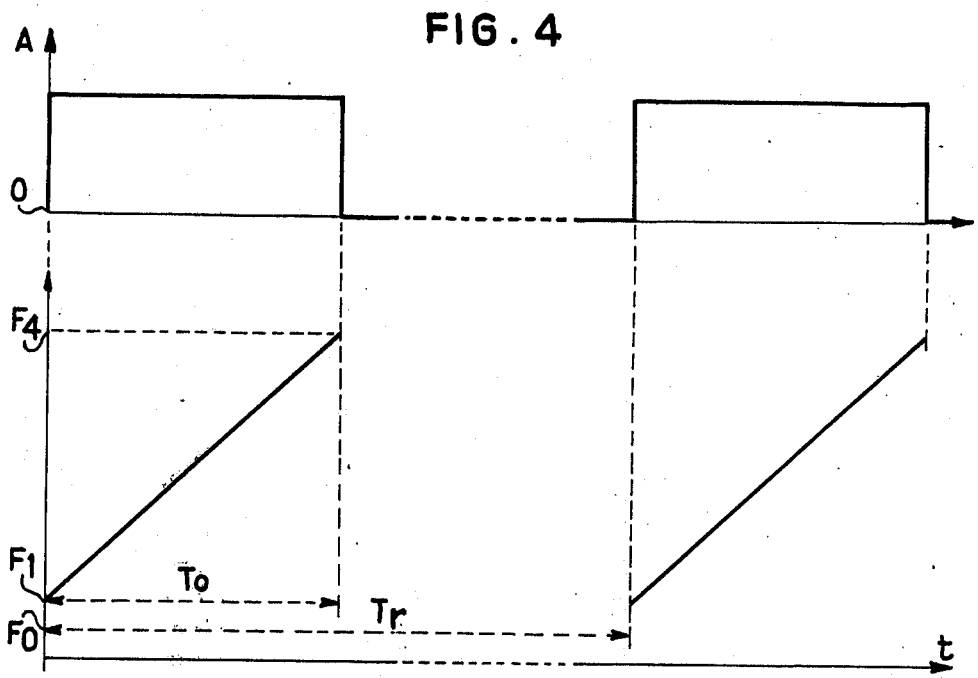
FIGS. 4 and 5 illustrate respectively the laws of variation, in frequency and amplitude, of an excitation signal, as well as the spectrum of excitation frequencies obtained in one mode of operation of the spectrometer shown in FIG. 1.
Figure 6:
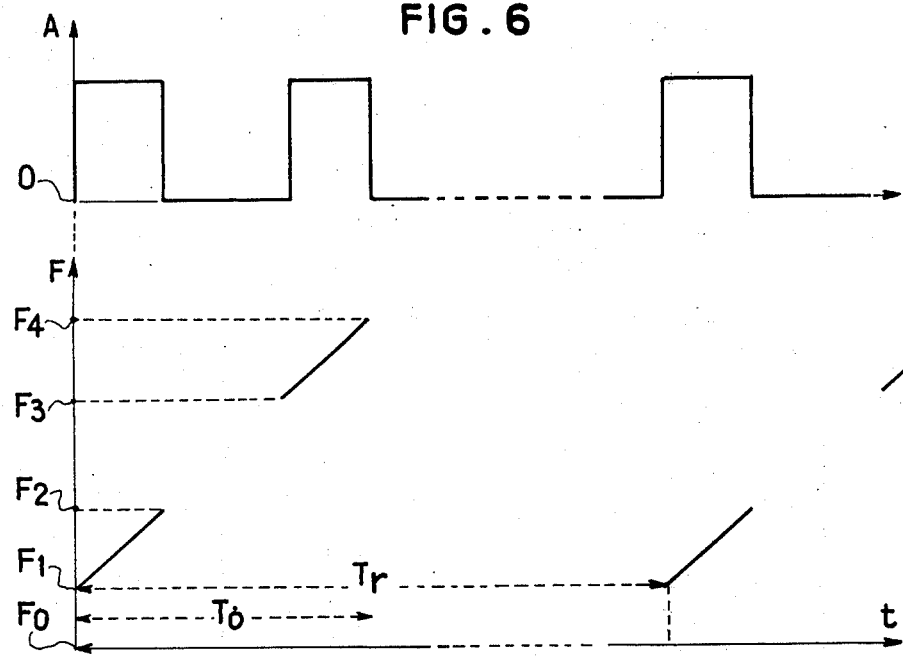
Figure 7:
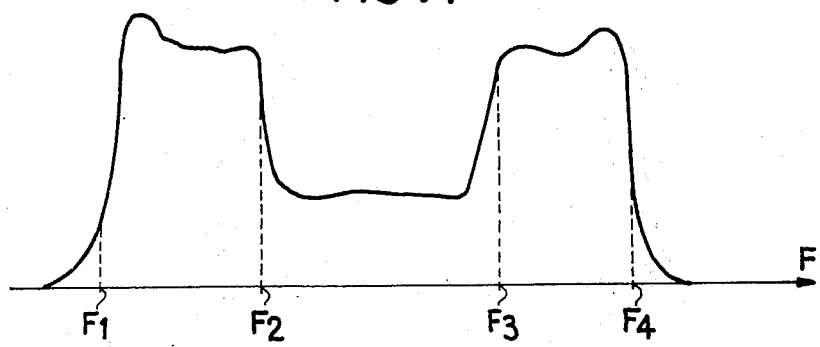
Figure 8:
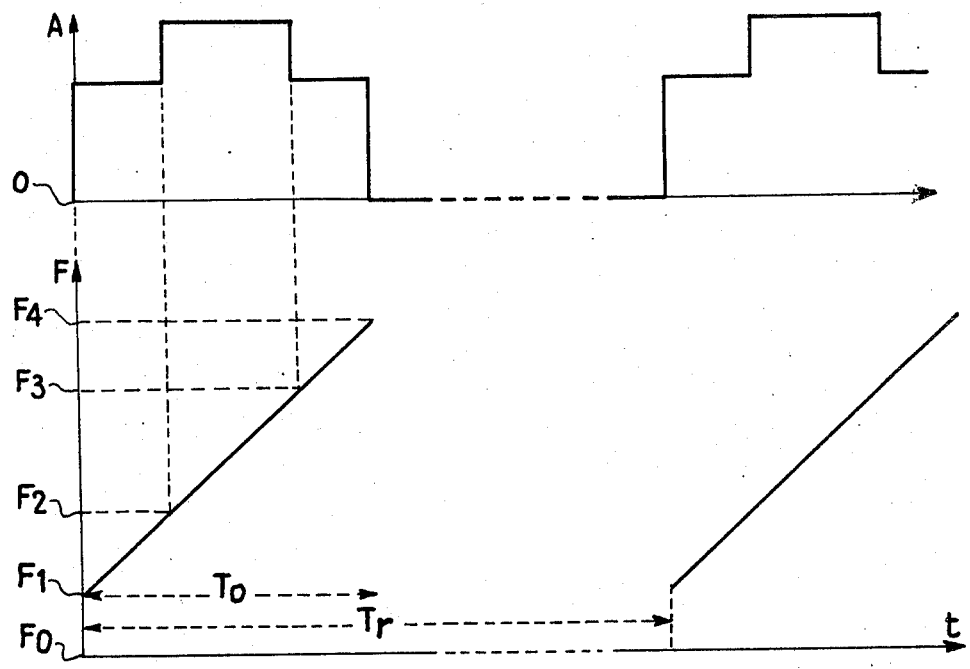
Figure 9:
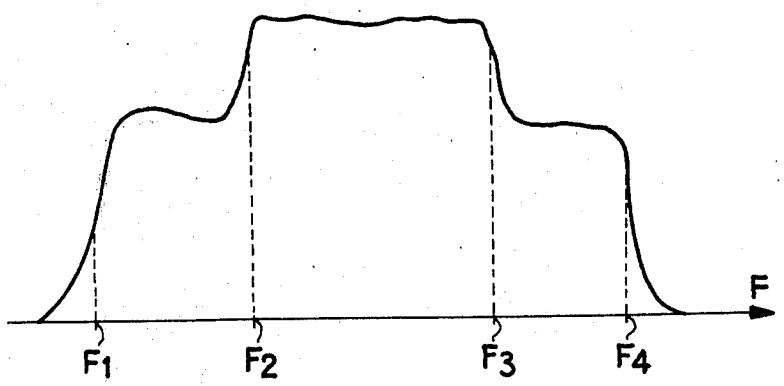
Figure 10:
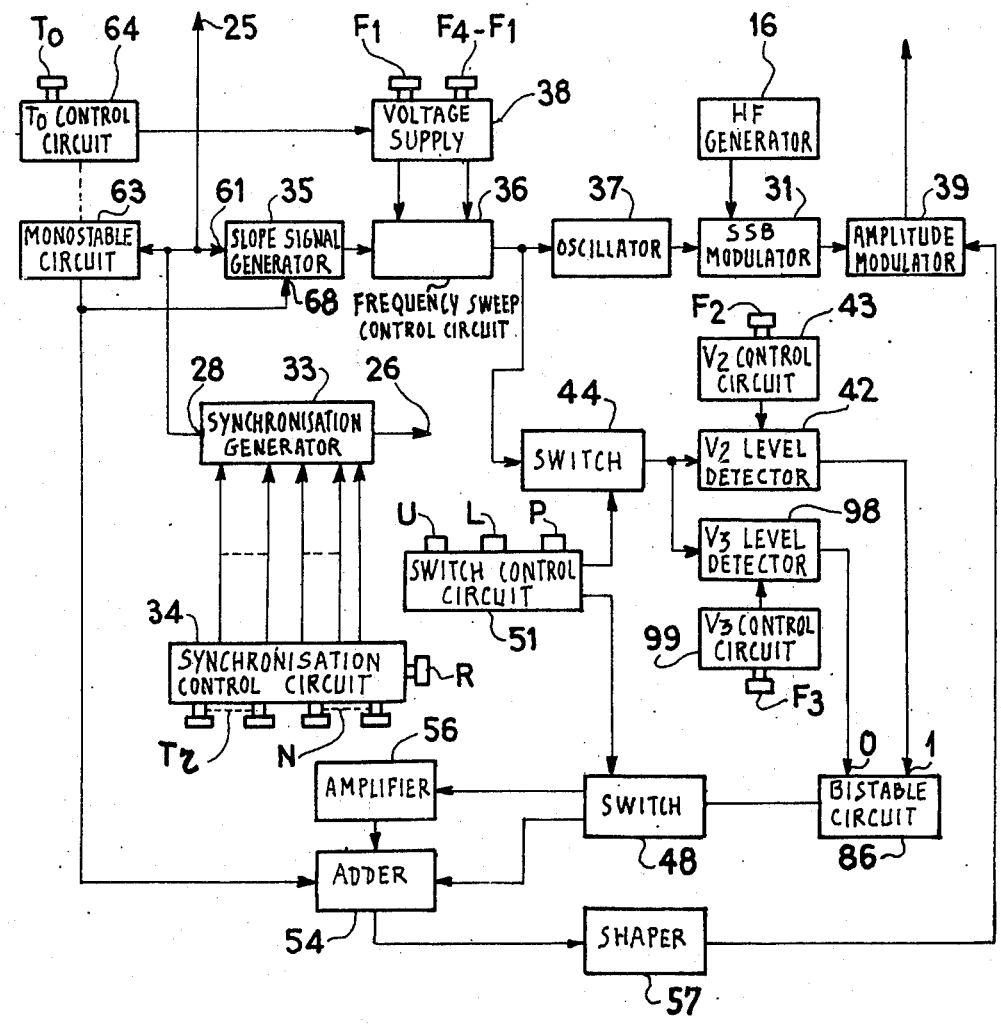
Figure 11:
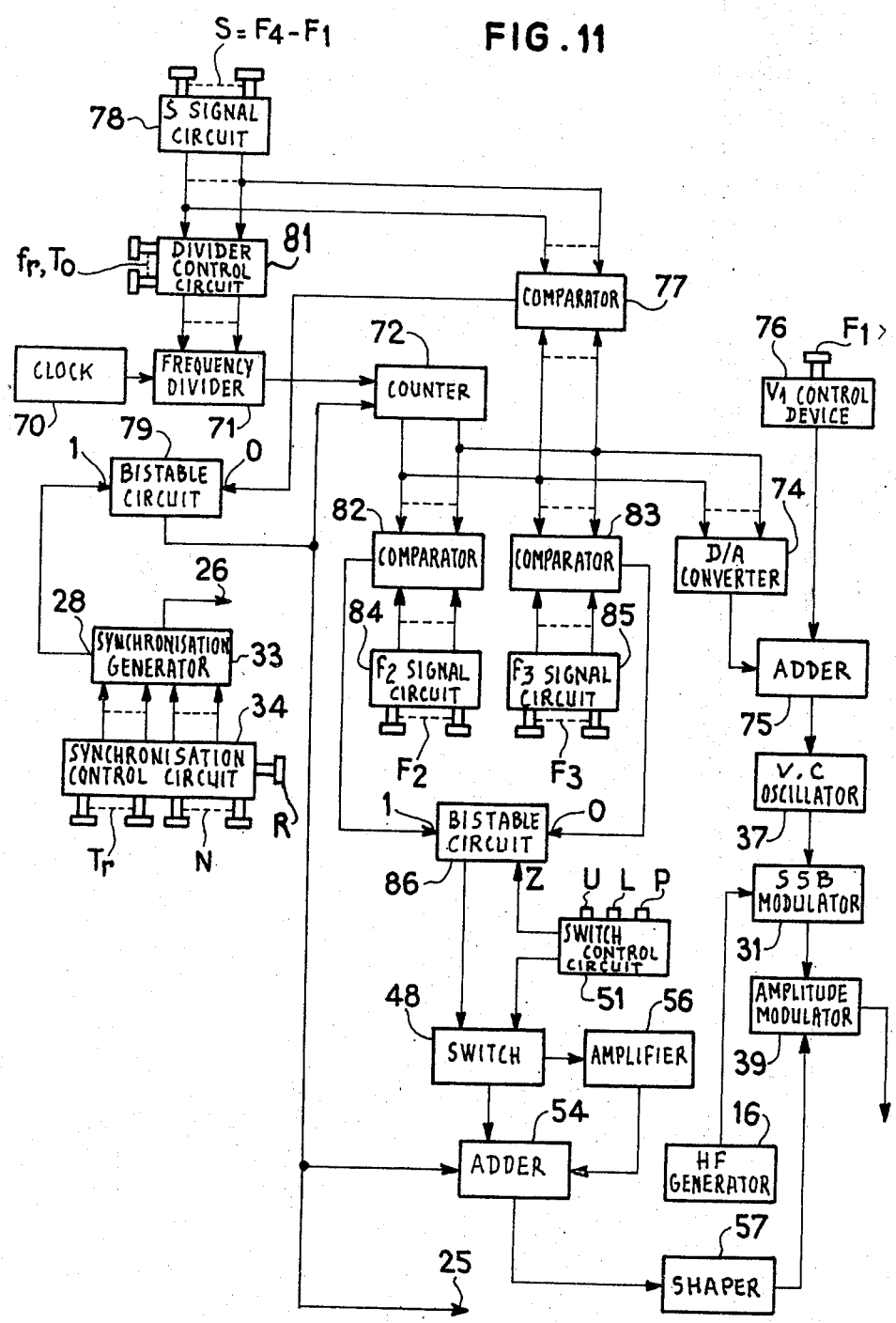

FIGS. 6 and 7 respectively illustrate the laws of variation, in frequency and amplitude, of an excitation signal as well as the spectrum of excitation frequencies obtained in another mode of operation of the spectrometer shown in FIG. 1;

FIGS. 8 and 9 illustrate the law of variation, in amplitude, of a signal frequency modulated in accordance with the law of FIG. 4, as well as the spectrum of excitation frequencies thus obtained in a third mode of operation of the spectrometer shown in FIG. 1;

FIG. 10 is the detailed diagram of the modulation circuit of the spectrometer shown in FIG. 1;

FIG. 11 illustrates a variant embodiment of the diagram of FIG. 10.

FIG. 1 schematically illustrates a nuclear magnetic resonance spectrometer in which the specimen for analysis, contained in a holder tube E, is arranged in a magnetic polarizing field of strength $H_o$ produced by an electromagnet 12 only the polepieces of which have been shown. The specimen is tightly coupled with an inductor 13 whose axis is perpendicular to the lines of force of the field $H_o$ and which forms part of a parallel resonant circuit comprising furthermore a variable capacitor 14 which enables tuning to the frequency $F_o$ of the high-frequency generator hereinbefore referred to, to be effected. This resonant circuit is arranged in one arm of a high-frequency bridge 15, a second arm of the bridge being supplied as follows:

a sinusoidal high-frequency generator, 16, of frequency $F_o$, has its output coupled to a frequency modulation and amplitude modulation circuit 17 supplying the electrical excitation signals to said arm through an amplifier 29.

The third arm of the bridge 15, through a high-frequency switch 18 and an amplifier 19, is connected to the signal input of a synchronous detector 22 whose reference input is connected through a phase-shifter 23 to the output of the generator 16.

The synchronous detector 22 supplies a response circuit 24 for processing, displaying and recording the impulse responses of the specimen, which device may be of any known type employed in pulse-excitation spectrometry, and in particular may be of the Fourier transform type referred to hereinbefore.

The circuit 17 has two auxiliary outputs 25 and 26 the first of which is connected to the control input of the switch 18 and to a first synchronisation input of the circuit 24, and the second of which is connected to a second synchronisation input of the circuit 24.

The spectrometer, neglecting the nature of the high-frequency field excitation pulses, operates in the conventional manner employed in the technique of pulse spectrometry. The device 17 supplies to the bridge 15 short excitation signals, for example lasting some few milliseconds, at a recurrence frequency of for example 1 Hz. Under the action of the electromagnetic field which is thus created, the specimen supplies in respect of each pulse an impulse response comprising an absorption signal and a dispersion signal.

The signal from the output 25 of the device 17, formed by squarewave pulses coinciding with the duration of the excitation signals, opens the switch 18 for the duration of the pulses and thus prevents an excessive amount of power reaching the circuits down-circuit of the switch. Consequently, the high-frequency signal carrying the impulse response of the specimen is slightly mutilated but, as will be familiar to those skilled in the art of pulse spectrometry, this does not cause serious drawbacks.

In accordance with the phase shift introduced by the phase-shifter 23, the synchronous detector either detects the dispersion impulse response or the absorption impulse response. More often than not it is the latter which is selected for detection.

The output of the synchronous detector 22 is connected to the main input of the circuit 24 which is synchronised on the one hand by the pulses from the output 25 of the circuit 17 and on the other by the signal coming from the output 26 of said circuit, this signal marking the end of the series of pulses used for a given analysis.

Figure 2:
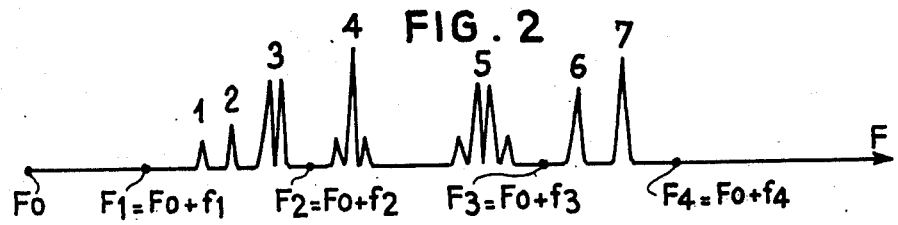
FIG. 2 is a diagram of a magnetic resonance spectrum.

FIG. 2 schematically illustrates a nuclear magnetic resonance spectrum of the type which can be obtained by sequential analysis and recording of the spectrum.

The different signals or discrete signal groups, have been numbered 1 to 7.

The frequency references have been given in the form $F_o$ and $F_i = F_o + f_i$ ($i = 1, 2, 3, 4$).

With the magnetic fields currently used, of the order of 10 to 70 kilogauss, the frequencies $F_o$ generally used range from 5 to 300 MHz. The dispersion in the spectra is generally of the order of some few kilohertz.

It will be assumed first of all that it is desired to cover the whole of the spectrum illustrated, with a substantially uniform excitation.

Figure 3:
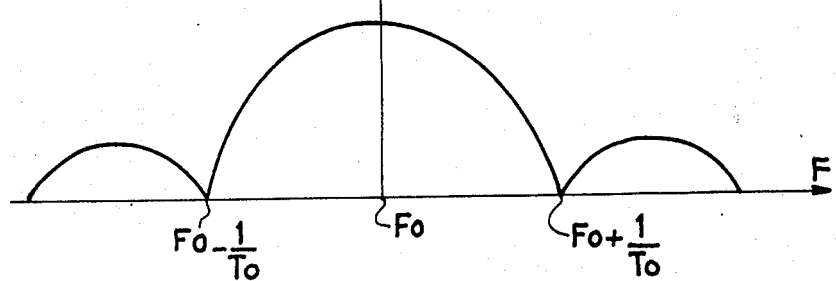
FIG. 3 illustrates, by way of comparison, an excitation spectrum obtained in conventional pulse-excited spectrometers.

FIG. 3 shows the shape of the envelope of the spectrum of excitation frequencies obtained, in accordance with the known technique by the simple chopping of a high-frequency sinusoidal wave to yield pulses of duration $T_o$ and recurrence frequency $F_r = 1/T_r$.

Within said envelope, the spectrum lines are separated by intervals of $F_r$. The centre frequency is the frequency $F_o$ of the high-frequency wave; the limits of the central lobe are equal to $F_o - 1/T_o$ and $F_o + 1/T_o$. It will be seen, therefore, that with a spectrum of this kind it is not very easy to obtain uniform excitation within a wide frequency band. In fact, it is generally considered that the nuclear magnetic resonance spectrum should not then cover a bandwidth in excess of $1/(4T_o)$.

On the other hand, the product $H_1 \cdot T_o$ has an optimum value determined by the nature of the nuclear magnetic resonance phenomenon. Finally, $H_1$ is limited in the upward direction by considerations of peak power.

The result is that $T_o$ cannot be given such low values as would otherwise be desirable.

In the spectrometer in accordance with the invention, in this case, by way of excitation signal a train of oscillations of duration T, is used, this train being linearly frequency-modulated and the frequency sweep conveniently overlapping, at the two ends, the range of frequencies limited by the extreme signals 1 and 7, the sweep in other words being from $F_1 = F_o + f_1$ to $F_4 = F_o + f_4$ (FIG. 2).

Figure 5:
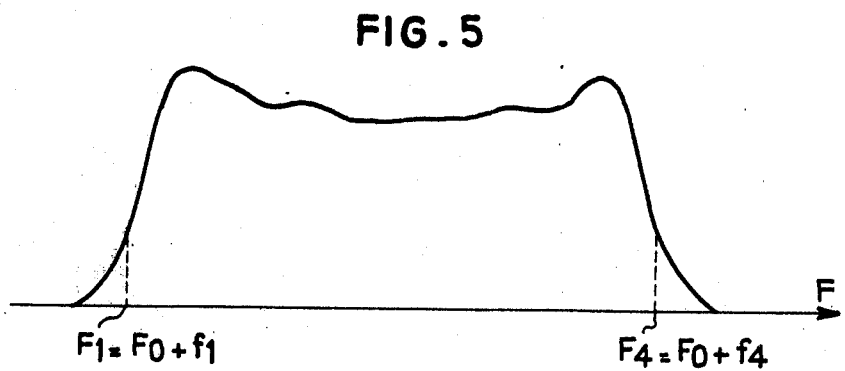

FIG. 4 illustrates the frequency variation and amplitude variation $A(t)$ and $F(t)$ of the excitation signal, and FIG. 5 illustrates the envelope of the excitation spectrum thus obtained, the spectrum lines of which, here again, are spaced apart by frequency intervals $\Delta F$ having a width equal to the recurrence frequency $F_r$ of the excitation signals.

Returning now to FIG. 2, it will be assumed that it is desired to exclude the signals 4 and 5 from the impulse response.

Accordingly, within the frequency sweep from $F_o + f_1$ to $F_o + f_4$, a gap will be produced by giving a zero value to the excitation signal during the time interval elapsing between $t_2$ and $t_3$ which would have corresponded to the sweeping of the frequencies ranging between $F_o + f_2$ and $F_o + f_3$ (FIG. 2). The frequencies $F_o + f_2$ and $F_o + f_3$ are chosen in order to make allowance to the same extent for the two following conditions: The band which they delimit overlaps at either side the minimum band containing the signals 4 and 5, and is separated by intervals, from the minimum bands respectively containing the signals 1, 2 and 3, and the signals 6 and 7.

FIG. 6 illustrates the laws of variation, in frequency and amplitude, of the excitation signal, and FIG. 7 illustrates the envelope of the excitation spectrum which is obtained; the spectrum lines are again separated by the aforementioned intervals ΔF.

Finally, it will now be assumed that it is desired to obtain an excitation signal for all the lines of the spectrum of FIG. 2, excitation of the groups of spectrum lines 4 and 5 being emphasized however for purposes of special experiment.

Then, on the linear frequency modulation represented in FIG. 4 there is superimposed an amplitude modulation, the modulating signal for which has been shown as a function of time and instantaneous frequency, in FIG. 8. The envelope of the corresponding excitation spectrum is shown in FIG. 9.

FIG. 10 is an embodiment of the circuit 17, which makes it possible to obtain signals of the aforesaid types, by using simple commands to vary appropriate parameters within the effective nuclear magnetic resonance limits.

In FIG. 10, the sinusoidal generator 16 has in addition been shown again, this operating at the frequency $F_o$ and having an output which supplies the carrier input of a single side-band modulator 31 effecting a frequency translation of $+ F_o$ of the frequency of the modulating signal applied to its modulating input, this signal being supplied by a low-frequency voltage controlled oscillator 37 the frequency of which varies linearly as a function of the control voltage, within the useful range of frequencies. The frequency $F_o$ is therefore chosen slightly lower than the instanteneous frequencies which it is desired to achieve.

The frequency control input of the oscillator 37 is supplied as follows:

A straight-lined slope signal generator 35 is triggered at its first control input 61 by a sequence of N pulses of recurrence frequency $F_r = 1/T_r$, for each of which it delivers a signal formed by a straight-lined slope terminating at the end of the time interval $T_o$, this being the duration of a pulse received at its second control input, 62; between two such slopes, the shape of the signal delivered by the generator 35 is of little consequence, as will be seen at a later point.

The sequence of N pulses applied to the input 61 is supplied by synchronisation generator 33.

The synchronising generator comprises a clock supplying a frequency-divider with a variable division ratio $d$, said frequency-divider delivering at the output 28 of the generator 33, the pulses which trigger the slope signals. The generator 33 furthermore comprises a counter supplied with these same pulses, and a comparator for comparing the count of the counter with a chosen number N, a count of N ensuring the blocking of the frequency-divider at the same time as the appearance of a pulse at the output 26 of the generator 33.

The values $d$, determining $F_r = 1/T_r$, and N, are determined for the generator 33 by a device 34 comprising two groups of outputs connected to the generator. The block 34 is manually operated, giving a direct display of the values $T_r$ and N. The block 34 likewise comprises a manual control (Z) for resetting the counter to zero on commencement of a series of pulses.

The signals applied to the input 68 of the generator 35 are supplied by a monostable trigger circuit 63, triggered at the same time as the generator 35 by the pulses furnished from the output 28 of the synchronisation generator 33.

The duration $T_o$ of the quasi stable state of this trigger circuit is adjustable and is determined by a device 64 which is a manually controlled device mechanically operating a potentiometer of the trigger circuit and displaying the value $T_o$.

The slope signals delivered by the generator 35 are applied to a circuit 36 which determines the frequency sweep.

If the frequency sweep is to be from $F_1 = F_o + f_1$ to $F_4 = F_o + f_4$, $f_1$ and $f_4$ being variable, the low-frequency oscillator 37 should have a frequency sweep of $f_1$ to $f_4$.

$V_i$ being the oscillator control voltage corresponding to a frequency $f_i$, it will be assumed that $V_j > V_i$ for $f_j > f_i$.

By means of the device 36 which is essentially formed by a variable-gain amplifier, the output slope from the slope generator 35 is converted into a slope of the same duration whose instantaneous value varies from $V_1$ to $V_4$.

This requires a gain control voltage and a direct voltage for addition to the amplified signal.

These voltages, are supplied to the circuit 36 by a circuit 38 comprising two outputs connected to the device 36. The device 38 is controlled manually and displays the value $F_1 = F_o + f_1$ and $F_4 - F_1 = f_4 - f_1$ directly.

The necessary gain control voltage varying in inverse proportion with $T_o$, a voltage proportional to $T_o$ is supplied to the circuit 38 by the device 64 the latter comprising to this effect a potentiometer device which is operated by the same manual control push-button as that which controls the value $T_o$ in the trigger circuit 63.

The slope in the output signal from the device 36, corresponding to the rise of $V_1$ to $V_4$, is the useful part in the formation of the high-frequency excitation pulses.

During the time $T_o$ of this slope, the low-frequency oscillator 37 delivers a signal whose instantaneous frequency varies from $f_1$ to $f_4$, and the modulator 31 imparts to this signal a frequency translation of $+ F_o$.

The output of the modulator 31 is connected to the carrier input of an amplitude modulator 39 whose modulation input supplies it with a modulating signal which, in all cases, chops it to form signals of duration $T_o$ (so that that part of the modulating signal which is applied to the input of the modulator 31 after the end of the time intervals $T_o$, is of no importance) and, if required, can produce in each excitation signal of duration $T_o$ either a gap which suppresses the frequency sweep in the interval from $F_2$ to $F_3$ (a signal of the kind illustrated by FIG. 6), or, instead, an upper step of amplitude corresponding to the partial sweep from frequency $F_2$ to $F_3$ (signal of the kind shown in FIG. 8), the values $F_2$ and $F_3$ being variable.

The corresponding modulating signal is obtained in the following way:

The monostable trigger circuit 63 supplies at an output connected to an adder 54, pulses of duration $T_o$ and of positive polarity.

Two level detectors 42 and 98 are connected in parallel, through a switch 44, to the output of the frequency sweep control circuit 36.

The opening and closing of the switch 44 are controlled by a circuit 51, itself manually operated; the circuit 51 will be described hereinafter.

The switch 44 is open if it is desired to obtain excitation pulses of the type illustrated by FIG. 4, that is to say without any "gap" or step.

If the contrary is the case, the switch 44 is closed.

If the switch is closed, the level detector 42 detects the transition of the output signal from the device 36 through the variable value $V_2$. It is controlled by a device 43 which supplies it with a control voltage determining voltage $V_2$. The device 43 is manually controlled and directly displays the value $F_2 = F_o + f_2$. The level detector 98 performs the same function in respect of the variable level $V_3$, by means of a control device 99 manually operated and providing a direct display of the corresponding value $F_3$. The output pulses from the level detectors 42 and 98 are respectively applied to the 1 and to the 0 input of a bistable trigger circuit 86.

The negative output pulses from the bistable trigger circuit 86 are transmitted by a switch 48 either directly to the second input 53 of the adder 54 whose first input is supplied with the positive output pulses from the trigger circuit 63, or to an amplifier 56 which amplifies them and reverses their polarity in order to supply positive pulses of higher level than the positive output pulses from the trigger circuit 63, the output of the amplifier 56 being connected to a third input of the adder 54.

The latter is followed by an amplifier and shaper circuit 57 delivering the signal which is applied to the modulating input of the modulator, so that the latter interrupts the output signal from the modulator when the adder 54 delivers a zero signal, also interrupts it during the time of any negative pulses included in the output signal from the adder 54, gives it a high level during the time of any output pulses from the amplifier 56, and gives it a low level for the remainder of the time.

The switch 44 and the switch 48 are controlled by means of one and the same control device 51 which supplies them with appropriate voltages, and is manually set to a desired mode of operation by means of three keys: U (uniform amplitude), L (gap) and P (step).

The output of the amplitude modulator is the output of the circuit 17 and is connected to the input of the amplifier 29.

The output 26 of the synchronisation generator 33 supplies the second synchronisation input of the response circuit 24, with the signal marking the end of the sequence of N pulses being used.

On the other hand, the monostable trigger circuit 63 comprises an output connected to the first synchronising input of the circuit 24 and to the control input of the switch 18, this output forming the output 25 of the circuit 17.

FIG. 11 illustrates a second embodiment of the circuit 17 shown in FIG. 1. Also reappearing in this figure, is the high-frequency oscillator 16.

The elements 33, 34, 37, 31, 39, 48, 54, 56, 57, 51 and 86, marked by the same references in FIG. 10, have the same significance.

The circuit 17 of FIG. 11 differs from that of FIG. 10 purely by the way in which the modulated signals applied to the low frequency oscillator 37 and the amplitude modulator 39 are produced.

The same symbols will be used as before.

A clock 70 of frequency $F_H$ supplies a frequency-divider 71 with a variable division ratio $d_1$, supplying pulses of recurrence frequency $f_r = F_H/d_1$, said frequency-divider itself supplying a counter 72.

The synchronizing signal at the frequency $F_r$ delivered as before by the output 28 of the synchronization generator 33, is applied to the input 1, i.e., for triggering into the 1 state, of a bistable trigger stage 79 which blocks the operation of the counter when it is in the 0 state and unblocks the counter when it is in the 1 state. The counter 72 has its outputs connected to the inputs of a comparator 77 for comparing the count of the counter with a number $S = f_4 - f_1 = F_4 - F_1$, said number $S$, in Hz, being chosen by means of the manually operated device 78 which also displays S. When the count of the comparator 77 reaches the number S, at the end of a time which, as will be seen later, has the duration $T_o$ of an excitation signal, the comparator supplies a signal which is applied to the 0 input of the trigger circuit 79, the latter then blocking the counter again.

The counter 72 supplies a digital-to-analog converter 74 furnishing a stepped voltage substantially similar to a slope voltage. The conversion ratio of the converter is such that the analog signal increases by $\Delta V$ when the count of the counter increases by one unit, $\Delta V$ corresponding to a frequency increase of 1 Hz on the part of the oscillator 37.

A direct voltage is added to the output signal from the digital-to-analog converter 74 in an adder 75, so that the initial voltage of the signal becomes $V_1$. The value of the direct voltage is supplied to the adder 75 by a manually operated device 76 which also displays the corresponding value $F_1 = F_o + f_1$.

This device can be employed in two ways:

It will be observed that the choice of the division ratio $d_1$ of the frequency-divider 71 determines the rate of variation of the instantaneous frequency of the excitation signal.

In other words, the number $f_r = F_H/d_1$ represents not only the supply frequency to the counter, in kHz for example, but also said rate of variation in kHz per second.

The division ratio $d_1$, given S, also determines the duration $T_o$ since we have the relationship $f_r \cdot T_o = S$.

The digital signals determining the value $d_1$ of the division ratio of the frequency-divider 71, are supplied to it by a manually operated device 81 which displays the corresponding value $f_r = F_H/d_1$ as well as the corresponding value $T_o = S/f_r = Sd_1/F_H$. To effect this latter display, the device 81 is supplied with the digital signals representing S, delivered by the device 78. It is thus possible to control $d_1$ in order to give a requisite frequency $f_r$ or duration $T_o$.

In order, if required, to create a gap or an upper step, between the frequencies $F_o + f_2$ and $F_o + f_3$, the output of the counter 72 is coupled to the first input of two further comparators comparing the count of the counter to variable numbers equal to $f_2$ and $f_3$ in Hz, which are respectively applied to the second input of the comparators by two devices 84 and 85, manually controlled and directly displaying the corresponding values $F_2 = F_o + f_2$ and $F_3 = F_o + f_3$.

The outputs of the comparators 82 and 83 are respectively connected to the 1 input and to the 0 input of the bistable trigger circuit 86 which, as in the circuit of FIG. 10, supplies a negative pulse when it is in the 1 state.

The remainder of the circuit comprises the same elements 48, 56, 54 and 57, and 51, as the circuit of FIG. 10, and operates in the same way, the sole differences being that the first input of the adder 54 is now supplied by the negative output pulses from the bistable trigger circuit 79 and that control, by the device 51, of the switch 44 in FIG. 10 is replaced here by control of a zeroing input Z, of the bistable trigger circuit 86, making it possible to block this trigger circuit in the zero state independently of the signals applied to its 1 and 0 inputs.

It should be pointed out that frequency-modulation by a signal U can be carried out in accordance with known art by means of phase-modulation using the signal which represents the integral of U.

It is possible to utilise this procedure to implement the invention but it does not offer the same facility as direct frequency modulation, in choosing the initial frequency of the frequency sweep range.

Of course, the invention is not limited to the embodiments described and shown which were given solely by way of example.

What is claimed, is:

1. A magnetic resonance spectrometer for operating with inpulse response, said spectrometer comprising: first means for the magnetic polarization of a specimen; second means for generating excitation signals having a period of recurrence $T_r$, and a duration $T_o$ shorter than $T_r$, said second means including a high-frequency oscillator, and a modulating circuit for both amplitude modulating and frequency modulating, with said period $T_r$, the output signal from said oscillator, so that each of said excitation signals be formed by at least one train of linearly frequency modulated oscillations; and detecting means for detecting the impulse response of said specimen to each of said excitation signals.

2. A spectrometer as claimed in claim 1, wherein said modulating circuit comprises a low-frequency oscillator, having a frequency control input, for being linearly frequency-modulated as a function of the signal applied to said control input, a single side-band modulator having a carrier input coupled to said high-frequency oscillator, a modulation input coupled to said low-frequency oscillator and an output, an amplitude modulator having an input coupled to said output of said single side-band modulator and a modulation input, a first auxiliary circuit having an output coupled to said control input for delivering to said control input a frequency-modulating signal which, during time intervals of duration $T_o$ and periodicity $T_r$, takes, at least approximately, the form of a straight-lined slope, and a second auxiliary circuit, having an output coupled to the modulation input of said amplitude modulator, for delivering to said modulation input an amplitude modulating square-wave signal having at least two levels, one level of which corresponds to suppression of the modulated output signal from the single side-band modulator, and the other to a non-zero amplitude of said modulated signal, said amplitude modulating signal exhibiting said one level at least during the time intervals other than said time intervals of duration $T_o$.

3. A spectrometer as claimed in claim 2, wherein said first auxiliary circuit comprises: a generator for generating straight-lined slope signals of duration $T_o$ and recurrence period $T_r$; and a circuit, comprising a variable-gain amplifier, for amplifying said slope signals and adding a direct voltage to the amplified slope signals.

4. A spectrometer as claimed in claim 2, wherein said first auxiliary circuit comprises a clock, a variable frequency-divider, coupled to said clock, and having an output, a counter having an input coupled to said output of said frequency-divider, and an output, means for unblocking said counter for the duration of each of said intervals of duration $T_o$, a digital-to-analog converter coupled to said output of said counter for being supplied with the digital signals representing the counts successively registered by said counter, and an adder for adding a direct voltage to the output signal from said digital-to-analog converter.

5. A spectrometer as claimed in claim 2, wherein said second auxiliary circuit comprises a detector device adapted for, during each of sadi intervals of duration $T_o$, detecting the instant $t_2$ at which the output signal from said first auxiliary circuit passes through a given value, means for selectively connecting said detector device to said outout of said auxiliary circuit or disconnecting said detector device from said output of said auxiliary device, means for, when said detection device is connected to said output of said auxiliary circuit, generating auxiliary pulses respectively commencing at said instants $t_2$ and respectively covering time intervals of one and the same duration $T_j$ respectively comprised withing said intervals $T_o$, and further means for giving to said amplitude modulating signal, during each of said time intervals of duration $T_o$, a second level outside the duration of said auxiliary pulses and, selectively, either the first level or a third level, during the duration of said auxiliary pulses.

6. A spectrometer as claimed in claim 5, wherein said first auxiliary circuit comprises a generator for generating straight-lined slope signals of duration $T_o$ and recurrence period $T_r$; and a circuit for processing said slope signals, comprising a variable-gain amplifier of said and means for adding to a direct voltage output signal from said variable-gain amplifier and wherein said detection device is a first level detector having an output and said further means comprise a second level detector, having an output and a bistable trigger circuit having two inputs respectively coupled to the outputs of said first and second level detectors.

7. A spectrometer as claimed in claim 5, wherein said first auxiliary circuit comprises a clock, a variable frequency-divider coupled to said clock and having an output, a counter having an input coupled to said output of said frequency-divider and an output, means for unblocking said counter for the duration of each of said intervals of duration $T_o$, a digital-to-analog converter coupled to the output of said counter for being supplied with the digital signals representing the counts successively registered by said counter, and an adder for adding a direct voltage to the output signal from the digital-to-analog converter, wherein said detector device is a first comparator for detecting the transition of the count reached by said counter through a given number, and wherein said further means comprise a second comparator for detecting the transition of the count reached by said counter through a further given number and a bistable trigger circuit whose two inputs are respectively coupled to the outputs said first and second comparators.

* * * * *